(12) United States Patent
Lim

(10) Patent No.: US 6,172,573 B1
(45) Date of Patent: Jan. 9, 2001

(54) OSCILLATOR HAVING COMPENSATION FOR A SCHMITT TRIGGER RESPONSE DELAY

(75) Inventor: Chang-Sik Lim, Bucheon (KR)

(73) Assignee: Fairchild Korea Semiconductor Ltd., Bucheon (KR)

(*) Notice: Under 35 U.S.C. 154(b), the term of this patent shall be extended for 0 days.

(21) Appl. No.: 09/384,898

(22) Filed: Aug. 27, 1999

(30) Foreign Application Priority Data

Oct. 20, 1998 (KR) .................................................. 98-43820

(51) Int. Cl.[7] ...................................................... H03B 5/24
(52) U.S. Cl. .......................... 331/111; 331/143; 331/175; 331/177 R
(58) Field of Search .................................. 331/111, 143, 331/175, 177 R

(56) References Cited

U.S. PATENT DOCUMENTS 5,990,753 * 11/1999 Danstrom et al. .................. 331/143

* cited by examiner

*Primary Examiner*—David Mis
(74) *Attorney, Agent, or Firm*—Marshall, O'Toole, Gerstein, Murray & Borun

(57) ABSTRACT

An oscillator having compensation for the response delays of a Schmitt trigger has a first current source that provides a charging current to a capacitor and a second current source for providing a discharging current to the capacitor. The oscillator includes a Schmitt trigger circuit that receives a charge/discharge voltage from the capacitor and generates a square wave oscillator output signal therefrom. The oscillator further includes charge and discharge current control units that compare the charge/discharge voltage from the capacitor to respective charge and discharge threshold voltages. Based on the comparison, the control units divert the flow of charging and discharging current from the capacitor during the response delays of the Schmitt trigger circuit.

9 Claims, 5 Drawing Sheets

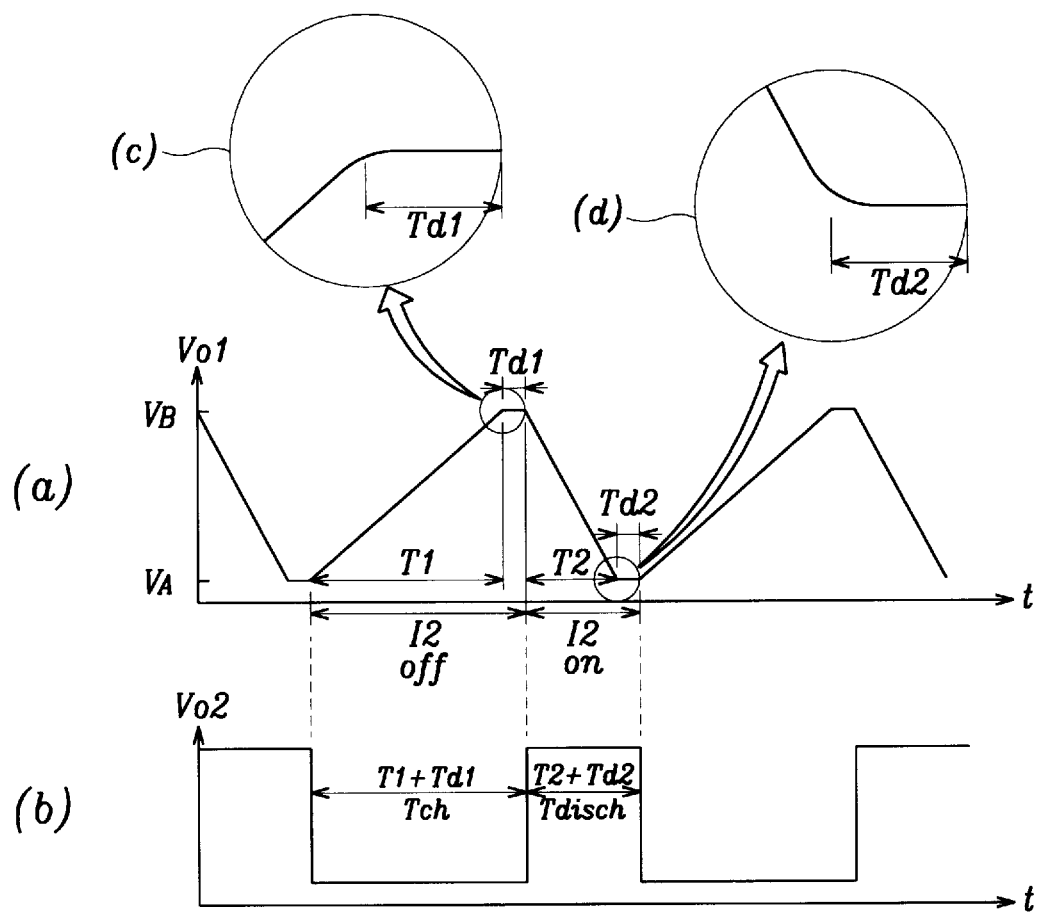

OSCILLATOR HAVING COMPENSATION FOR A SCHMITT TRIGGER RESPONSE DELAY

BACKGROUND OF THE INVENTION

1. Field of the Invention

The invention relates to an oscillator having a Schmitt trigger. More specifically, the invention relates to an oscillator having compensation for a response delay of the Schmitt trigger.

2. Description of Related Technology

FIG. 1 illustrates a schematic diagram of a conventional Schmitt trigger oscillator 10. The conventional oscillator 10 includes a charging current source I1, a discharging current source I2, a Schmitt trigger 12, and a capacitor C1, all coupled together as shown. The oscillator 10 provides a square wave output signal Vo2 having a frequency based on the currents supplied by the current sources I1, I2, the value of the capacitor C1, and the logic thresholds of the Schmitt trigger 12.

In general, the charging current source I1 is always on and draws power from a supply Vcc to charge the capacitor C1 with a charging current. When the discharging current source I2 is off, the charging current flows into the capacitor C1 and a charge/discharge voltage Vo1 increases linearly. When the charge/discharge voltage Vo1 crosses a high logic or charge threshold voltage of the Schmitt trigger 12, the oscillator output signal Vo2 transitions to a high level, which turns on the discharging current source I2. Because the discharging current source I2 draws more current than supplied by the charging current source I1, a net charge is removed from the capacitor C1 and the charge/discharge voltage Vo1 across the capacitor C1 decreases. When the charge/discharge voltage Vo1 crosses a low logic or discharge threshold voltage, which is lower than the charge threshold voltage, the output of the Schmitt trigger 12 transitions to a low level, thereby deactivating the discharging current source I2 to begin the charge/discharge cycle again.

FIG. 2 illustrates idealized graphical representations of the input and output signals associated with the Schmitt trigger 12 of FIG. 1. In particular, detail (a) shows the charge/discharge voltage Vo1, which is coupled to the input of the Schmitt trigger 12. As shown by detail (a), the charging period T1 is a function of the charging current and the voltage difference between the charge threshold voltage VB and the discharge threshold voltage VA. Similarly, the discharge period T2 is a function of the net discharge current (I2−I1) divided by the value of the capacitor C1 and the voltage difference between the charge threshold voltage VB and the discharge threshold voltage VA.

Detail (b) of FIG. 2 shows the continuous square wave output signal Vo2 of the Schmitt trigger 12. As shown by detail (b), while the oscillator output signal Vo2 is at a high level, the discharging current source I2 is on and the capacitor C1 is discharging. Additionally, while the oscillator output signal Vo2 is at a low level, the discharging current source I2 is off and the capacitor C1 is charged via the charging current source I1.

FIG. 3 illustrates graphical representations of the charge/discharge voltage Vo1 and the oscillator output signal Vo2 as affected by a charge response delay Td of the Schmitt trigger 12 used in the oscillator 10 of FIG. 1. The charge response delay Td of the Schmitt trigger 12 occurs as the output of the Schmitt trigger 12 transitions between charge and discharge modes of operation. As a result of the response delay Td, the minimum charge voltage of the capacitor C1 undershoots the discharge threshold voltage VA of the Schmitt trigger 12, and the maximum charge voltage of the capacitor C1 overshoots the charge threshold VB of the Schmitt trigger 12. Because the effective charge and discharge threshold voltages have moved apart to VY and VX, respectively, the period of the charge/discharge voltage Vo1 increases and the frequency decreases.

Detail (b) of FIG. 3 shows the oscillator output signal Vo2 that results from the non-ideal charge/discharge voltage Vo1 shown in detail (a). As shown by detail (b) of FIG. 3, the interval during which the oscillator output signal Vo2 is at a low level increases to T1' and the interval during which the oscillator output signal Vo2 is at a high level increases to T2'. The charge response delay Td causes the charging of the capacitor C1 to terminate at the higher voltage VY, which exceeds the ideal charge threshold voltage VB by an amount equal to the charging rate I1/C1 multiplied by the response delay time Td. Similarly, the charge response delay Td causes the discharging of the capacitor C1 to terminate at the lower voltage VX, which is less than the ideal discharge threshold voltage VA by an amount equal to the discharge rate multiplied by the response delay time Td.

The charging interval T1', during which the discharging current source I2 is off, and the discharge interval T2', during which the discharging current source I2 is on, can be expressed as a function of the response delay time Td, the charging current I1, and the discharging current I2, as shown in Equations 1 and 2 below.

$$T1' = T1 + Td\left(1 + \frac{I2-I1}{I1}\right) \quad \text{Equation 1}$$

$$T2' = T2 + Td\left(1 + \frac{I1}{I2-I1}\right) \quad \text{Equation 2}$$

For Equations 1 and 2 above, the value of I2 is assumed to be greater than I1 so that the discharging current source I2 can draw a net charge away from the capacitor C1 while the charging current source I1 is on. As can be seen from Equations 1 and 1, as the value of I2 increases for a given value of I1 the value of T1' increases rapidly to exceed T1+Td and the value of T2' approaches T2+Td. As Equations 1 and 2 demonstrate, even small variations in the response delay time Td of the Schmitt trigger 12 can result in large variations in the charging interval T1', particularly where the discharge rate is relatively high compared to the charge rate. These variations in the charging interval become problematic when using the above-described Schmitt trigger oscillator 10 as a radio frequency oscillator. Furthermore, these problems are compounded significantly in radio frequency oscillator applications requiring a relatively large duty cycle because the response delay time Td has a proportionally larger impact on the control of the charging interval as the desired charging interval time decreases.

SUMMARY OF THE INVENTION

Generally, the invention provides an oscillator having compensation for the response delays of a Schmitt trigger so that output signal of the Schmitt trigger oscillator is not substantially affected by the response delays. The oscillator may include a first current source coupled to a supply voltage and adapted to produce a charging current, a charge current control unit coupled to the first current source and a ground potential, and a charge and discharge unit coupled to the charge current control unit. The oscillator may further include a discharge current control unit coupled to the charge and discharge unit, a second current source unit coupled to the discharge current control unit and the ground potential and adapted to produce a discharge current, and a Schmitt trigger circuit coupled to the supply voltage, the charge current control unit, the discharge unit control unit, the second current source, and the charge and discharge unit.

The Schmitt trigger circuit may be adapted to receive a charge/discharge voltage from the charge and discharge unit and to generate an output signal therefrom. The Schmitt trigger circuit may additionally provide a charge threshold voltage to the charge control unit. The charge current control unit may be adapted to compare the charge/discharge voltage to the charge threshold voltage and, based on the comparison, to divert the charging current from the charge and discharge unit. The Schmitt trigger circuit may additionally provide a discharge threshold voltage to the discharge control unit and the discharge current control may be adapted to compare the charge/discharge voltage to the discharge threshold and, based on the comparison, to divert the discharge current from the charge and discharge unit.

The invention itself, together with further objects and attendant advantages, will best be understood by reference to the following detailed description, taken in conjunction with the accompanying drawings.

BRIEF DESCRIPTION OF THE DRAWINGS

FIG. 6 illustrates the input and output waveforms associated with the oscillator of FIGS. 3 and 4.

DETAILED DESCRIPTION OF THE PREFERRED EMBODIMENTS

Figure 4:
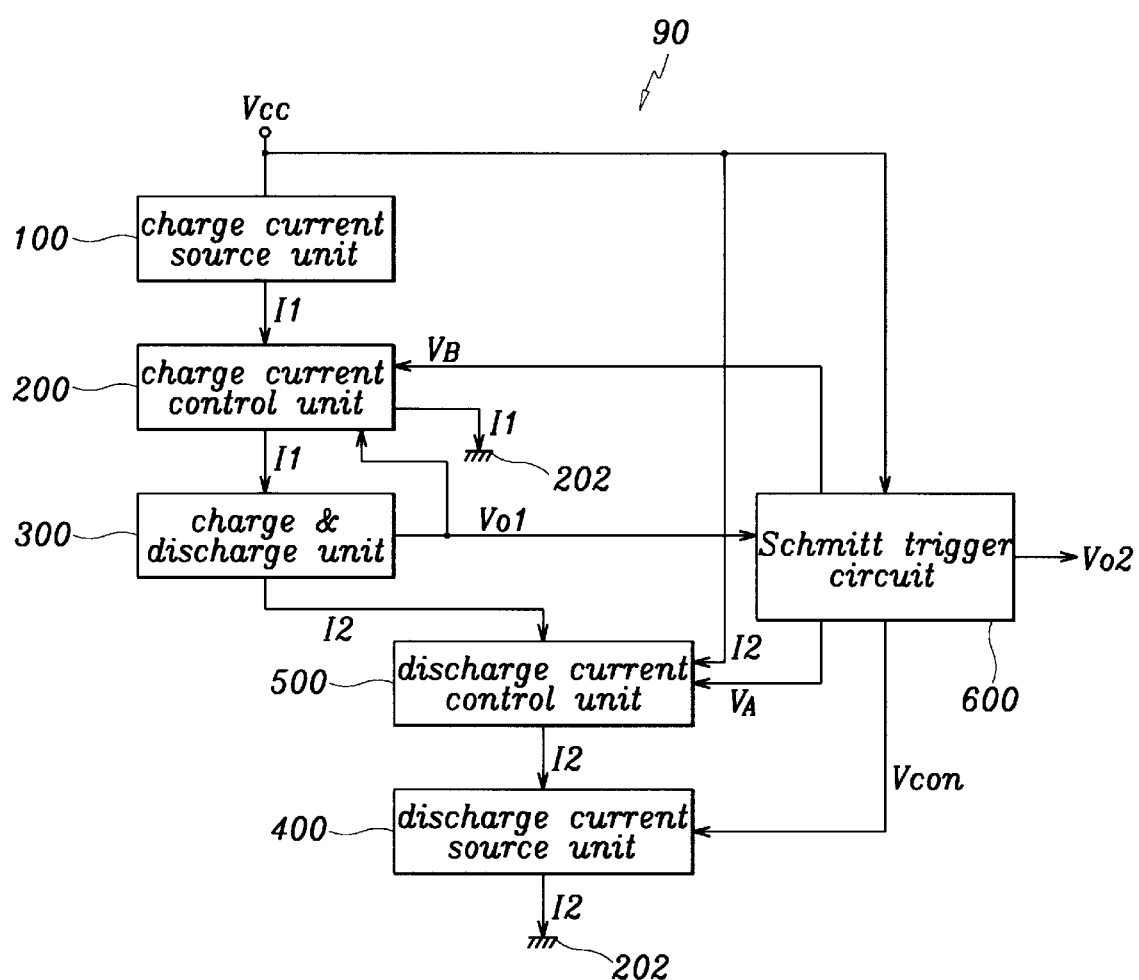
FIG. 4 is a block diagram of an oscillator according to the invention having compensation for the response delays of a Schmitt trigger.

FIG. 4 is a block diagram of an oscillator 90 according to the invention having compensation for the response delays of a Schmitt trigger. The oscillator 90 includes a charge current source unit 100, a charge current control unit 200, a charge and discharge unit 300, a discharge current source unit 400, a discharge current control unit 500, and a Schmitt trigger circuit unit 600.

The charge current source unit 100 is coupled to a supply voltage Vcc and supplies a continuous current I1 to the charge current control unit 200 when the supply voltage Vcc is present. The charge current control unit 200 receives the current I1 from the charge current source unit 100 and, as described in more detail below, routes the current I1 to the charge and discharge unit 300 or shunts it to a ground potential 202. The charge and discharge unit 300 generates a charge/discharge voltage Vo1, which is provided to the charge current control unit 200 and the Schmitt trigger circuit unit 600. The discharge current source unit 400, as described in more detail below, periodically generates a current I2 in response to signals received from the Schmitt trigger circuit unit 600. The discharge current control unit 500 draws the current I2 through the charge and discharge unit 300 or from the supply Vcc. The Schmitt trigger circuit unit 600 receives power from the supply Vcc and generates an oscillator output signal Vo2 in response to the charge/discharge voltage Vo1. The Schmitt trigger circuit unit 600 provides a charge threshold voltage VB to the charge current control unit 300, a discharge threshold voltage VA to the discharge current control unit 500, and a control voltage Vcon to the discharge current source unit 400.

In operation, the charge and discharge unit 300 is initially discharged so that the charge/discharge voltage Vo1 is at a level associated with the discharged condition (e.g., zero volts). Also, initially, the oscillator output signal Vo2 of the Schmitt trigger circuit unit 600 and the control signal Vcon are at a low level so that the discharge current source unit 400 is off. While the level of the charge/discharge voltage Vo1 is less than the charge threshold voltage VB, the charge control unit 300 routes the current I1 from the charge current source unit 100 to the charge and discharge unit 300, and the charge/discharge voltage Vo1 increases linearly.

When the charge/discharge voltage Vo1 crosses the charge threshold voltage VB, the charge current control unit 200 diverts the current I1 away from the charge and discharge unit 300 and shunts it to the ground potential 202 so that the charge/discharge voltage Vo1 stops increasing. Additionally, following a charge response delay Td, the output of the Schmitt trigger circuit unit 600 and the control signal Vcon transition to a high level. The discharge current source unit 400 is turned on by the high level control signal Vcon and draws the current I2 through the discharge current control unit 500.

While the charge/discharge voltage Vo1 is greater than the discharge threshold voltage VA, the discharge current control unit 500 draws current I2 from the charge and discharge unit 300, thereby decreasing the charge/discharge voltage Vo1. When the charge/discharge voltage Vo1 falls below the charge threshold voltage VB, the charge current control unit 200 routes the current I1 to the charge and discharge unit 300; however, because the current I2 is greater than the current I1, a net current I2−I1 is removed from the charge and discharge unit 300, which causes the charge/discharge voltage Vo1 to decrease linearly.

When the charge/discharge voltage Vo1 falls below the discharge threshold voltage VA, the discharge current control unit 500 stops drawing current I2 from the charge and discharge unit 300 and begins to draw the current I2 from the supply Vcc. After the response delay Td, the oscillator output signal Vo2 of the Schmitt trigger circuit unit 600 and the control signal Vcon both transition to a low level. The low level control signal Vcon turns off the discharge current source unit 400 so that the current I1 flowing into the charge and discharge unit 300 causes the charge/discharge voltage Vo1 to increase linearly, thereby re-starting the above-described charge/discharge cycle. The charge/discharge cycle repeats continuously so that the oscillator output signal Vo2 provides a continuous square wave signal having a low-level portion consistent with the charge interval and a high level portion consistent with the discharge interval.

Figure 5:
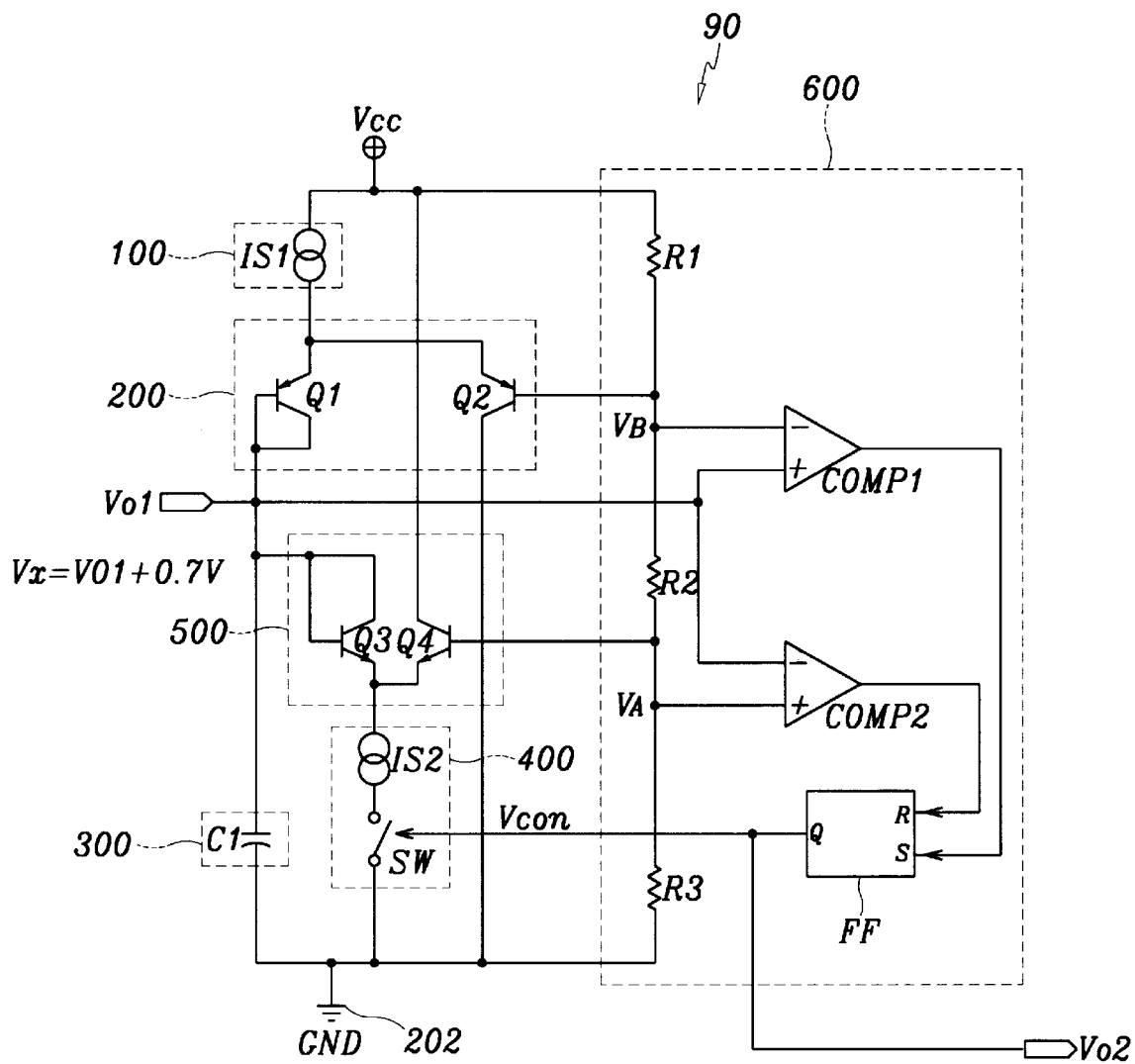
FIG. 5 is an exemplary schematic diagram of the oscillator of FIG. 4.

FIG. 5 is an exemplary schematic diagram of the oscillator 90 of FIG. 4. The charge current control unit 200 includes PNP transistors Q1 and Q2 connected in a differential (i.e., emitter coupled) configuration. The emitters of Q1 and Q2 receive the current I1 from the charge current source unit 100, which is represented as a constant current source IS1 that draws power from the supply Vcc. The collector of Q1 is connected to the charge and discharge unit 300, which is a capacitor C1, and the collector of Q2 is connected to the ground potential 202. The base terminal of Q2 receives the charge threshold voltage VB from the Schmitt trigger circuit unit 600.

The discharge current control unit 500 includes NPN transistors Q3 and Q4 connected in a differential configuration. The collector and base terminals of Q3 are connected to the capacitor C1 of the charge and discharge unit 300 and the collector terminal of Q4 is connected to the supply voltage Vcc. The emitters of Q3 and Q4 are both connected to the discharge current source unit 400, and the base of Q4 is connected to the discharge threshold voltage VA from the Schmitt trigger circuit unit 600. The discharge current source unit 400 includes a current source IS2 that generates a current I2 and further includes a switch SW that is turned on/off (i.e., closed/open) based on the control signal Vcon from the Schmitt trigger circuit unit 600.

The Schmitt trigger circuit unit 600 includes resistors R1–R3, first and second comparators Comp1, Comp2, and an RS flip-flop FF, coupled together as shown. The resistors R1–R3 form a voltage divider network between the supply voltage Vcc and the ground potential 202, thereby generating the charge threshold voltage VB and the discharge threshold voltage VA at the nodes formed by R1/R2 and R2/R3, respectively. The first comparator Comp1 receives the charge threshold voltage VB at an inverting input, receives the charge/discharge voltage Vo1 at a non-inverting input, and provides an output based on the comparison to a set input S of the flip-flop FF. The second comparator Comp2 receives the discharge threshold voltage VA at a non-inverting terminal, receives the charge/discharge voltage Vo1 at an inverting input, and provides an output based on the comparison to a reset input R of the flip-flop FF. The output Q of the flip-flop FF is used as the control signal Vcon and the oscillator output signal Vo2.

In operation, the capacitor C1 is initially discharged so that the charge/discharge voltage Vo1 is substantially near zero volts, the output of the second comparator Comp2 is at a high level, the output Q of the flip-flop is at a low level, which causes the control voltage Vcon and the oscillator output signal Vo2 to both be at a low level, and the switch SW is off, which causes transistors Q3 and Q4 to both be off. Also, initially, because the charge/discharge voltage Vo1 is less than the charge threshold voltage VB, transistor Q1 is on and transistor Q2 is off so that the current I1 provided by the current source IS1 flows into the capacitor C1.

As the current I1 flows into C1, the voltage on C1 increases linearly. When the charge/discharge voltage Vo1 exceeds the discharge voltage threshold VA the output of the second comparator Comp2 transitions to a low level, thereby providing a low level input to the R input of the flip-flop FF. As the voltage Vo1 approaches the charge threshold voltage VB, transistor Q1 begins to turn off and transistor Q2 begins to turn on. When the charge/discharge voltage Vo1 exceeds the charge threshold voltage VB, Q1 turns off and Q2 turns on to shunt the current I1 to the ground potential 202, thereby preventing further current from flowing into capacitor C1 so that the charge/discharge voltage Vo1 stops increasing. Additionally, when the charge/discharge voltage Vo1 exceeds the charge threshold VB, after a response delay, the output of the first comparator Comp1 transitions to a high level. The high level output of the first comparator Comp1 is provided to the S input of the flip-flop FF, which causes the output Q of the flip-flop FF, the control voltage Vcon, and the oscillator output Vo2 to all transition to a high level.

The high level control signal Vcon causes the switch SW to close, which provides a current path for the second current source IS2 to turn on transistor Q3 and to draw the current I2 through Q3. Thus, Q3 begins to draw current from C1, which causes the charge/discharge voltage Vo1 to decrease. Although Q1 is momentarily off when Q3 begins to draw current from C1, as the charge/discharge voltage Vo1 falls below the charge threshold VB, Q1 turns on to supply the current I1. However, the current I2 drawn by the second current source IS2 is greater than the current I1 so that a net current I2–I1 is removed from C1, thereby causing the charge/discharge voltage Vo1 across C1 to decrease linearly.

When the charge/discharge voltage Vo1 approaches the discharge threshold VA, the transistor Q3 begins to turn off and Q4 begins to turn on so that current is no longer removed from C1 and the charge/discharge voltage Vo1 stops decreasing. Additionally, when Vo1 falls below VA, after a response delay, the second comparator Comp2 transitions to a high level output, which drives the reset input R of the flip-flop FF high so that the flip-flop output Q and the oscillator output signal Vo2 transition to a low level. The low level control signal Vcon causes the switch SW to open, which disables Q3 and Q4 to prevent additional current from being drawn from C1. The above described charge/discharge cycle repeats continuously so that the oscillator output signal Vo2 is a square wave type waveform.

In contrast to conventional Schmitt trigger oscillators, the oscillator 90 uses transistors Q1–Q4 to divert the flow of charging and discharging currents so that they do not flow into or out of C1 during the response delay time of the Schmitt trigger circuit 600. Thus, the circuit shown in FIG. 5 prevents the charge/discharge voltage Vo1 from substantially exceeding the charge threshold voltage VB and from falling substantially below the discharge threshold voltage VA.

Figure 1:
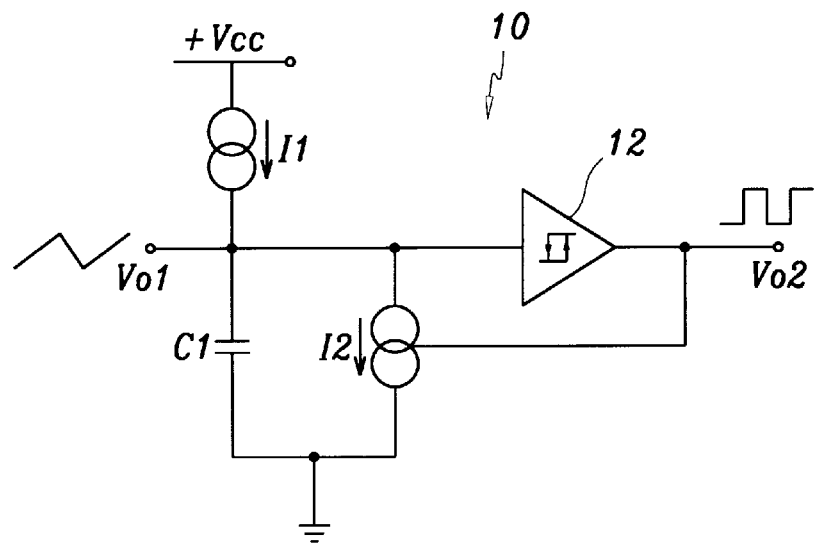
FIG. 1 illustrates a schematic diagram of a conventional Schmitt trigger based oscillator.
Figure 2:
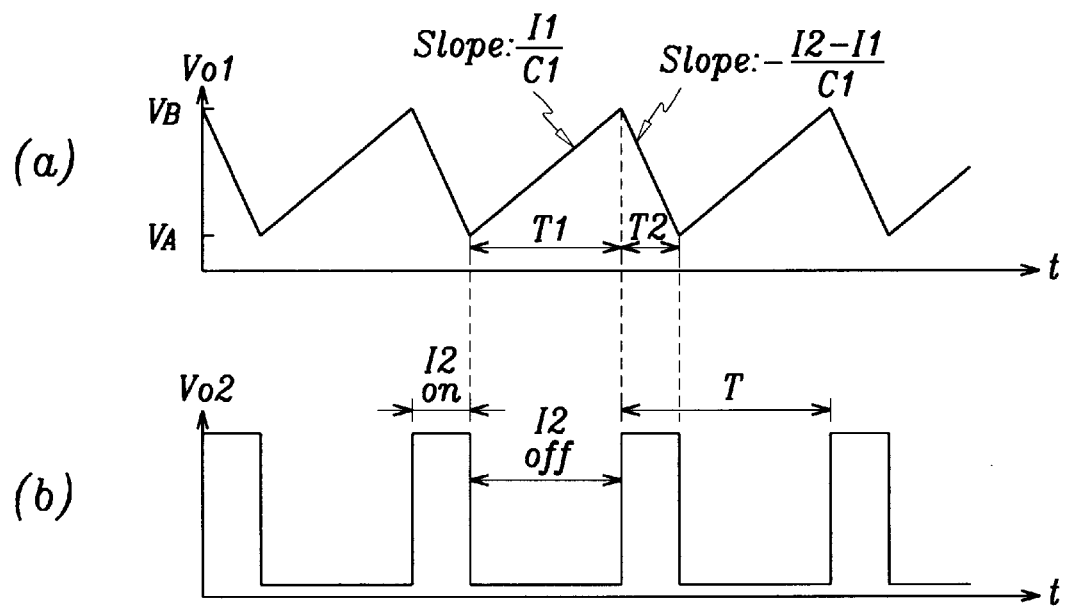
FIG. 2 illustrates idealized graphical representations of the input and output signals associated with the Schmitt trigger of FIG. 1.
Figure 3:
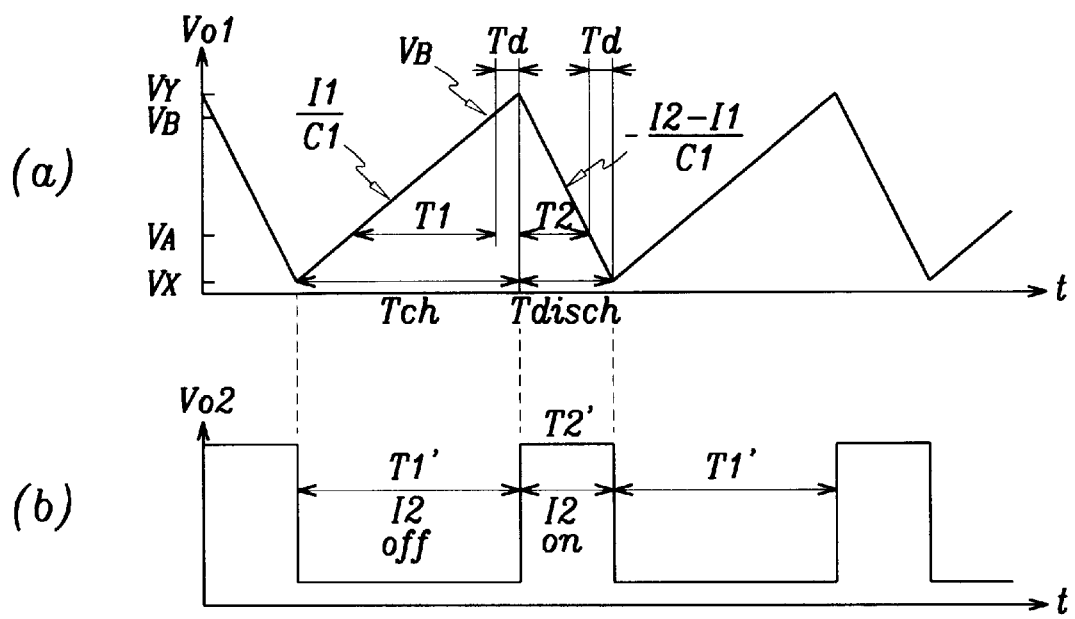
FIG. 3 illustrates graphical representations of the charge/discharge voltage and the oscillator output signal as affected by a charge response delay of the Schmitt trigger used in the oscillator of FIG. 1.

FIG. 6 illustrates the input and output waveforms associated with the oscillator 90 of FIGS. 3 and 4. Detail (a) shows the charge/discharge voltage Vo1 and detail (b) shows the oscillator output signal Vo2. Details (c) and (d) highlight the shape of the charge/discharge voltage Vo1 at the point in time where transistors Q2 and Q4 are being turned on to shunt current away from C1 to hold the voltage on C1 constant during the response delay intervals Td1 and Td2.

As shown in FIG. 6, the charge and discharge periods are increased by an amount equal to the response delay times Td1 and Td2 of the Schmitt trigger circuit 600 and are not affected by the relative sizes of the charge and discharge currents. Thus, the above-described invention provides a predictable error in the form of a constant delay for the charge and discharge intervals, which facilitates radio frequency oscillator applications that requiring accurate frequency characteristics.

A range of changes and modifications can be made to the preferred embodiment described above. The foregoing detailed description should be regarded as illustrative rather than limiting and the following claims, including all equivalents, are intended to define the scope of the invention.

What is claimed is:

1. An oscillator having compensation for a Schmitt trigger response delay, the oscillator comprising:

a first current source coupled to a supply voltage and adapted to produce a charging current;

a charge current control unit coupled to the first current source and a ground potential;

a charge and discharge unit coupled to the charge current control unit;

a discharge current control unit coupled to the charge and discharge unit;

a second current source coupled to the discharge current control unit and the ground potential and adapted to produce a discharge current; and a Schmitt trigger circuit coupled to the supply voltage, the charge current control unit, the discharge current control unit, the second current source and the charge and discharge unit, the Schmitt trigger circuit being adapted to (a) receive a charge/discharge voltage from the charge and discharge unit to generate an output signal therefrom, (b) provide a charge threshold voltage to the charge current control unit and the charge current control unit being adapted to compare the charge/discharge voltage to the charge threshold voltage and based on the comparison to divert the charging current from the charge and discharge unit, and, (c) provide a discharge threshold voltage to the discharge current control unit and the discharge current control unit being adapted to compare the charge/discharge voltage to the discharge threshold voltage and based on the comparison to divert the discharge current from the charge and discharge unit.

2. The oscillator of claim 1, wherein the charge and discharge currents are diverted from the charge and discharge unit during first and second respective response delay times of the Schmitt trigger circuit.

3. The oscillator of claim 1, wherein the charge current control unit comprises:

a first transistor having an emitter coupled to the first current source and a base and a collector coupled to each other and to the charge and discharge unit; and a second transistor having an emitter coupled to the first current source, a base coupled to the charge threshold voltage, and a collector connected to the ground potential.

4. The oscillator of claim 3, wherein the charge current control unit is further adapted to turn the first transistor on during a charging interval of the charge and discharge unit, to turn the second transistor on during a first response delay of the Schmitt trigger circuit, and to turn the first and second transistors off during a discharge interval of the charge and discharge unit.

5. The oscillator of claim 4, wherein the charge current control unit turns the first and second transistors on during the first response delay of the Schmitt trigger circuit during which the current flowing through the second transistor is substantially larger than the current flowing through the first transistor.

6. The oscillator of claim 1, wherein the discharge current control unit comprises:

a third transistor having an emitter coupled to the second current source and a base and a collector coupled to each other and to the charge and discharge unit; and a fourth transistor having an emitter coupled to the second current source, a base coupled to the Schmitt trigger circuit, and a collector coupled to the supply voltage.

7. The oscillator of claim 6, wherein the discharge current control unit is further adapted to turn the third transistor on during a discharge interval of the charge and discharge unit, to turn the fourth transistor on during a second response delay of the Schmitt trigger circuit, and to turn the third and fourth transistors off during a charge interval of the charge and discharge unit.

8. The oscillator of claim 7, wherein the discharge current control unit is further adapted to turn the third and fourth transistors on during a second response delay of the Schmitt trigger circuit and the current flowing through the fourth transistor is substantially larger than the current flowing through the third transistor.

9. The oscillator of claim 1, wherein the Schmitt trigger circuit comprises:

first, second, and third resistors serially coupled to the supply voltage;

a first comparator adapted to receive the charge threshold voltage at a first inverting terminal and to receive the charge/discharge voltage at a first noninverting terminal;

a second comparator adapted to receive the discharge threshold voltage at a second inverting terminal and to receive the charge/discharge voltage at a second noninverting terminal; and an RS flip-flop adapted to receive an output of the first comparator at a set terminal and to receive an output of the second comparator at a reset terminal.

* * * * *